United States Patent [19]

Frantz

[11] 4,158,719
[45] Jun. 19, 1979

[54] LOW EXPANSION LOW RESISTIVITY COMPOSITE POWDER METALLURGY MEMBER AND METHOD OF MAKING THE SAME

[75] Inventor: Earl L. Frantz, Reading, Pa.

[73] Assignee: Carpenter Technology Corporation, Reading, Pa.

[21] Appl. No.: 805,040

[22] Filed: Jun. 9, 1977

[51] Int. Cl.² ............................................. B22F 3/00
[52] U.S. Cl. .................................... 428/567; 75/200; 75/208 R
[58] Field of Search ............... 75/200, 208 R, 208 CS; 428/567

[56] References Cited

U.S. PATENT DOCUMENTS

| | | | |
|---|---|---|---|
| 3,120,436 | 2/1964 | Harrison | 428/567 |
| 3,652,261 | 3/1972 | Taubenblat | 428/567 |
| 3,853,551 | 12/1974 | Esper et al. | 75/200 |
| 4,032,301 | 6/1977 | Hassler et al. | 428/567 |

OTHER PUBLICATIONS

Goetzel, Treats on Powder Metallurgy, vol. 1, 1949, p. 6.

Primary Examiner—Brooks H. Hunt
Attorney, Agent, or Firm—Edgar N. Jay

[57] ABSTRACT

A compacted article having low thermal expansivity and high thermal conductivity is made by compacting a mixture of two metal powders, one of which has low thermal expansivity and the other of which has high thermal conductivity, and strip material made therefrom which is suitable for use in forming the supportive lead frames in integrated circuit components. The powders are mixed together, formed into a green preform, sintered, and rolled to size to produce compacted or densified strip which has a unique combination of low thermal expansivity and high thermal conductivity. A low-expansivity metal disclosed in an alloy containing about 45–70% iron, 20–55% nickel, up to 25% cobalt, and up to 5% chromium which in powder form is mixed with a high-conductivity metal powder disclosed as substantially elemental iron, copper or nickel.

25 Claims, No Drawings

LOW EXPANSION LOW RESISTIVITY COMPOSITE POWDER METALLURGY MEMBER AND METHOD OF MAKING THE SAME

BACKGROUND OF THE INVENTION

This invention relates to metallic members or articles including those suitable for making strip and, more particularly, to such articles made by powder metallurgy techniques having a unique combination of thermal and electrical properties and especially well suited for making lead frames of the type used in integrated circuits.

A lead frame is a thin metal structure on which an integrated circuit chip is mounted. It serves as means for supporting the chip and for electrically connecting the chip to other components. After the chip has been attached to the lead frame, it is generally sealed in an insulative and protective material such as a glass, ceramic or plastic, with the lead frame extending through the sealing material to provide connection with the chip.

It is desirable that the metal strip material from which the lead frames are produced have a certain unique combination of properties to enable the efficient manufacture of these components, particularly in mass production. The thermal expansion of the lead frame material should be matched to that of the sealing material over the temperature range at which it is sealed. The general range of thermal expansion coefficients desired for the lead frame material is about 4 to $12 \times 10^{-6}/°C$. averaged over the temperature range of about 25° C. to about 400° C., which is a relatively low expansivity for alloys. Furthermore, it is desirable to provide lead frame material with sufficiently low thermal expansivity to allow direct attachment of the silicon chip, which has low expansivity, using eutectic soldering methods wherein the chip and frame are normally heated to about 400° C. and wherein it is important that the chip and frame have approximately the same expansivity. In accordance with the common practice, hereinafter when an expansion coefficient is given at a certain temperature, it is intended to mean the average expansion coefficient over the temperature range of 25° C. to that temperature.

Another important lead frame property in integrated circuit component manufacture is a relatively high thermal conductivity. This is necessary for heat transfer away from the silicon chip during manufacturing steps such as soldering or brazing as well as during operation of the integrated circuits some of which operate at relatively high power levels. Other desired properties include solderability and sufficient stampability and ductility to permit forming and to resist failure from bending fatigue.

Iron-nickel and iron-nickel-cobalt low-expansion alloys with thermal expansion coefficients below $10 \times 10^{-6}/°C$. at 400° C. have been used for lead frame strip because of their low expansivity. One commonly used material is a 42% nickel iron-nickel alloy which combines low thermal expansivity with good solderability, ductility, and stampability. However, these low-expansion alloys leave much to be desired because of their relatively high cost because of the high nickel content and their relatively low thermal conductivity. One method of overcoming the thermal conductivity problem has been to plate the lead frame with silver which can increase the conductivity to the desired level. However, this is an expensive practice which significantly increases the cost of articles made from these already expensive nickel alloys.

SUMMARY OF THE INVENTION

It is, therefore, a principal object of this invention to provide a sintered, densified, shaped member or article suitable for making lead frame strip material which combines low thermal expansivity with high thermal conductivity.

It is a further object of this invention to provide such a member which also has suitable solderability, ductility, and formability, including stampability, for lead frame applications.

Another object is to provide an improved process for making articles having a unique combination of thermal and electrical properties.

The foregoing as well as additional objects and advantages of the present invention are achieved by providing a sintered, densified, shaped member or article, suitable for making composite lead frame strip material, which is prepared from a mixture of a low thermal expansivity alloy powder and a powdered metal or alloy of high thermal conductivity. The powders are blended, sintered and formed into a compacted article, preferably of substantially theoretical density and further shaped as desired. Preferably, the compacted article is rolled to form lead frame strip material. By controlling heating time and temperature, as well as other process variables, care is taken throughout the forming process to insure that the amount of alloying between the particles of the low thermal expansivity alloy powder and the high thermal conductivity metal is minimized to that which is necessary to bind the powders into a suitably coherent article or strip material.

DESCRIPTION OF THE PREFERRED EMBODIMENTS

The present invention will now be described in detail in accordance with a preferred embodiment thereof for forming lead frame strip material. Two complementary powdered metals, one of which has low thermal expansivity and the other of which has high thermal conductivity are thoroughly mixed or blended. The selection of the low-expansivity metal depends in part on the expansivity of the complementary high-conductivity metal and on the desired expansivity of the lead frame strip. As previously discussed, it is desired to match the expansivity of the lead frame strip with materials whose 400° C. thermal expansion coefficients range from about 4 to $12 \times 10^{-6}/°C$. and, therefore, it is preferred to provide a lead frame strip with an expansivity within that range, and even more preferable to provide such strip with a 400° C. expansion coefficient of less than about $10 \times 10^{-6}/°C$. For this reason, a low-expansivity metal suitable for use with this invention should have a 400° C. thermal expansion coefficient of less than about $12 \times 10^{-6}/°C$., preferably less than about $10 \times 10^{-6}/°C$. A class of alloys which provides the desired expansion coefficients for the low-expansivity metal are the iron-nickel and iron-nickel-cobalt controlled-expansion alloys. The predominant elements of these alloys are iron and nickel which coact to provide an austenitic microstructure, in which the cobalt may be substituted for some of the nickel. A preferred composition for alloys of this type comprises, in weight percent (w/o), about 45 to 70% iron, about 20 to 55% nickel, up to about 25% cobalt, and up to about 5% chromium, which is balanced to provide an alloy with a 400° C. thermal expansion coefficient of less than about $12 \times 10^{-6}$/°C., preferably less than about $10 \times 10^{-6}$/°C. Hereinafter, all percents used in alloy compositions will be by weight unless otherwise stated.

When the alloy is of the iron-nickel type, without any significant amount of cobalt, a minimum of 30% nickel is required, since alloys containing less nickel tend to form ferrite which greatly increases the expansivity of the alloy. As the nickel content is increased from 30%, the expansivity first decreases and then increases, until above about 55% nickel the expansivity of the alloy becomes too high to be suitable for use as the low-expansivity metal powder of the present invention. Commonly used nickel-iron low-expansion alloys are those containing between 35 and 52 w/o nickel, the expansivity of which will be discussed further hereinbelow.

Up to about 25% cobalt may be used in addition to or in place of some of the nickel to further lower thermal expansivity and to increase corrosion resistance. The nickel content can be lowered to a minimum of 20% when enough cobalt is added to prevent the formation of ferrite and to maintain the desired low expansivity. Amounts of cobalt more than about 25% do not significantly reduce expansivity, and simply add to the cost of the alloy.

A small amount of chromium may be added to improve corrosion resistance, but because it acts to increase expansivity and decrease thermal conductivity, not more than 5% should be present.

The thermal conductivity of a material may be characterized in terms of its electrical resistivity which is the inverse of electrical conductivity, which, in turn, is proportional to thermal conductivity. The high thermal conductivity metal powder for use in this invention has an electrical resistivity of less than about 200 ohm-circular mils per foot (ohm/cmf), which is about 33.2 microhm-cm, and preferably less than 100 ohm/cmf (16.6 microhm-cm). Three suitable high-conductivity metals which are preferred for use with this invention are substantially elemental iron, copper, and nickel which may contain alloying elements within the limits set forth hereinbelow. A number of other elemental metals such as silver, gold, and platinum also have suitable conductivities, but are considered to be prohibitively expensive. Elemental aluminum has a suitable conductivity, but its low melting point coupled with a tendency to reduce ductility when it alloys with iron-nickel alloys makes it less suitable than the preferred iron, copper and nickel.

At this time, iron is the least expensive of the three metals, with copper at least twice as expensive depending on the quality of the particular iron being considered, and with nickel being about three times as expensive as copper. Copper has the lowest resistivity of the three metals, about 10 ohm/cmf (1.7 microhm-cm), with nickel at about 41 ohm/cmf (6.8 microhm-cm), and iron (99.98% pure) at about 60 ohm/cmf (10 microhm-cm), all measured at about 20° C. Copper and nickel are both more corrosion resistant than iron, which is susceptible to rusting. Of the three, iron has the lowest expansivity and copper the highest, with 25° C. linear expansion coefficients ($\times 10^6$) per °C. of 12 for iron, 13 for nickel, and 16.6 for copper. Nickel offers the highest strength and hardness of the three metals, with copper having the lowest. In addition, the properties of the complementary low-expansivity alloy will also affect the determination of which high-conductivity metal is most suitable. To obtain the maximum conductivity, the amount of alloying additions and impurities should be minimized, with 99% or purer elemental metals being preferred to provide the highest conductivity. Some of the less desired properties of these high-conductivity metals may be improved by the addition of alloying elements within the following limits, but such alloying additions may result in a reduction in conductivity.

When the high-conductivity material is primarily iron, a minimum of about 90% iron is required in the composition of the material to provide the desired conductivity. Up to about 10% chromium can be added to improve corrosion resistance. Up to about 10% nickel can be added to improve corrosion resistance, and also to lower expansivity. Minor additions of copper can also be made to improve corrosion resistance, but only up to a maximum of about 5%, because this is about the solubility limit of copper in iron at room temperature.

When the high-conductivity material is primarily copper, a minimum of about 80% is required in the composition of the material to provide the desired conductivity. Up to about 20% nickel can be added to lower the expansivity. The addition of nickel also affects the characteristic reddish color of the copper which would otherwise contrast with the grey metallic color of the low-expansion metal. Up to about 20% zinc can also be added, but will slightly increase the expansivity and lower the conductivity of the material. An addition of aluminum can be made to harden the copper alloy, with the additional benefit of a slight lowering of the expansivity. However, no more than about 10% aluminum should be added because of its adverse effect on conductivity. Either iron or beryllium, but not both, can be added as a strengthening agent up to a maximum of about 3% which is the solubility limit of each in copper.

When the high-conductivity material is primarily nickel, a minimum of about 80% is required for the desired thermal conductivity. Up to about 20% copper or iron can be added to reduce the cost of the metal with a tolerable reduction of conductivity.

The high-conductivity metal powder is combined with the low-expansivity alloy powder to provide a composite strip material with a thermal conductivity higher than that of the low-expansivity alloy and an expansivity lower than that of the high-conductivity metal. The strip material is characterized as being a composite because the two different types of powder particles which are thoroughly intermixed throughout the strip substantially remain distinct, with a minimum of alloying between particles as will be discussed further hereinafter. Preferably, the composite strip material has a resistivity of less than about 200 ohm/cmf (33 microhm-cm), and, more preferably, less than about 150 ohm/cmf (25 microhm-cm). It is even more preferable to provide strip material which also has a thermal expansivity at 400° C. of less than $12 \times 10^{-6}$/°C., better yet, less than $10 \times 10^{-6}$/°C., as well as a resistivity of less than 200 ohm/cmf, better yet, less than 150 ohm/cmf.

In making lead frame strip in accordance with this invention, complementary high-conductivity and low-expansivity powdered metals are used which will produce strip material with the desired properties. A rough estimate of the expansivity of the composite strip can be calculated by taking the average of the known expansivities of the component metals, adjusting according to the volumetric proportions of each, as will be more fully discussed in connection with the examples hereinafter described.

Each of the metal components is melted and formed into powder using standard techniques. Excellent results were obtained by using water-atomized powders because the irregular shape of these powders lends itself to a high degree of compaction, as is well known. Other techniques for providing powder, such as gas-atomization or chemical methods can also be used.

The two powders are then blended in proportions to obtain the desired combination of thermal conductivity and thermal expansivity as well as the other significant properties necessary for the final product. With a 50-50 volumetric blend of the two powders, the properties of the strip material are approximately the average for those of the component metals. When the blend comprises more than 50 volume percent of the high thermal conductivity powder, a minimum of 15 volume percent of the low thermal expansivity powder should be used to effect a significant reduction in the expansivity of the composite strip material as compared to the expansivity of the high-conductivity material. Preferably, at least 40 volume percent of the low-expansivity powder is used to achieve a good balance of properties. In like manner, when more than 50 volume percent of the low-expansivity powder is used, a minimum of 15 volume percent, preferably 40 volume percent, of the high-conductivity powder should be used to obtain the desired balance of properties.

The blended powders are then formed into an intermediate article such as slab or strip, preferably the latter, and densified to substantially theoretical density using any suitable, known techniques. In one method which gave good results, the component powders are blended using known methods and are then charged into a fluidized bed having a suitable protective gas as the fluidizing medium. The blended powder is then pressed into a green preform such as a strip, which can be formed by feeding the powder into the nip of a roll compacting mill, preferably using means which feed the powder directly from the fluidized bed into the mill.

The thus-formed green preform or strip is then sintered in a suitable protective atmosphere at a temperature which is dependent on the particular component compositions. In general, the sintering temperature should be at least about 100° F. (55° C.) below the lower of the melting points of the two components, so as to minimize alloying between the components. Such alloying was found to be undesirable, as will be discussed further hereinbelow. Similarly, sintering time should also be minimized to reduce alloying with sintering times of 2 to 6 minutes giving good results.

The sintered article is then formed into lead frame strip, preferably by the following procedure. First, it is cold rolled into strip of an intermediate size after which it is stress relieved by annealing in a suitable protective atmosphere. The annealing temperature should be below that used in sintering, and, as is well known, would depend on the particular materials and procedure being used. Here again, a short annealing time is desirable and annealing for about 2 to 5 minutes gave good results. After annealing, the strip is then cold rolled to finished size, either directly or after a series of reductions with intermediate anneals as required. In commercial-scale operation, each reduction is preferably about 5 to 40% and, more preferably, about 10 to 30%, although for the small laboratory-scale examples given hereinbelow, reductions of 30–50% and larger were used.

EXAMPLES 1-3

Examples 1-3, illustrative of lead frame strip materials made in accordance with the present invention, were made as follows: The low-expansivity metals used were 42% nickel and 50% nickel iron-nickel alloys, designated herein as Alloy A and Alloy B, respectively. Each alloy was prepared according to standard melting procedure, and water atomized into powder, the compositions of which are given in Table I and the mesh fraction analyses of which are given in Table II.

TABLE I

|  | Alloy A | Alloy B |
| --- | --- | --- |
| Carbon | 0.022 | 0.021 |
| Manganese | 0.42 | — |
| Silicon | 0.15 | 0.019 |
| Sulfur | 0.013 | 0.016 |
| Nickel | 41.31 | 49.2 |
| Copper | 0.19 | — |
| Cobalt | 0.13 | — |
| Iron | Bal. | Bal. |

For convenience, the mesh fraction analyses of the higher conductivity iron and copper powder components are also given in Table II. In Table II, for each sieve, the U.S. Sieve Series designations and mesh openings in micrometers are given with the percent of each size powder held by that sieve, and the percent of powder which passed through the last sieve in each analysis indicated as −200 or −325. The absence of an amount for a particular sieve indicates that that sieve was not used in that analysis.

TABLE II

| Sieve No. (U.S.) | Opening (μm) | Percent held by Sieve | | | |
| --- | --- | --- | --- | --- | --- |
| | | Alloy A | Alloy B | Iron | Copper |
| 40 | 420 | 1.1 | — | — | — |
| 60 | 250 | 6.4 | — | 0 | — |
| 80 | 177 | 13.3 | — | 4.0 | — |
| 100 | 149 | 8.4 | 2 | 7.0 | — |
| 140 | 105 | 14.9 | 17 | 16.0 | — |
| 200 | 74 | 21.1 | 25 | 21.0 | 5 |
| −200 | — | — | — | — | 95 |
| 230 | 63 | — | — | 9.0 | — |
| 325 | 44 | 17.4 | 28 | 18.0 | — |
| −325 | — | 17.5 | 28 | 25.0 | — |
| | | 100.1% | 100% | 100.0% | 100% |

The high-conductivity metals used in these examples were water atomized commercially pure iron powder and electrolytic commercially pure copper powder. The iron powder had a chemical analysis of 99.1 w/o iron, with 0.06 w/o carbon, 0.20 w/o manganese, 0.05 w/o silicon, 0.008 w/o phosphorus, 0.015 w/o sulfur, with the balance being incidental impurities. The copper powder contained 99.5 w/o copper, with 0.05 w/o iron, 0.03 w/o lead, 0.01 w/o sulfur, 0.08 w/o acid insoluble impurities, and characterized by a loss in hydrogen of 0.28 w/o (A.S.T.M. E-159). The sieve analyses of these powders is given in Table II, with the copper powder simply indicated as 5% +200 mesh and the balance −200 mesh.

Example 1 was prepared as a 50/50 w/o mixture of −230 mesh copper powder and −40 mesh Alloy A powder, equivalent to about 48 volume percent copper powder. Example 2 was prepared as a 50/50 w/o mixture of +100 mesh iron powder and −40 mesh Alloy A powder, and Example 3 as a 50/50 w/o mixture of +100 mesh iron powder and −100 mesh Alloy B powder, both these examples being equivalent to about 51 volume percent iron powder. Each mixture was blended one hour in a ball mill blender and then compacted at 99 thousand pounds per square inch (ksi) in a hydraulic press to green preform coupons 2 inches by 1½ inches by about 0.20 inch thick (5.1 cm×3.8 cm×5.1 mm). The green preforms of Examples 2 and 3 were then sintered at 2300° F. (1260° C.) while the green preform of Example 1 containing the lower melting point copper was sintered at 1850° F. (1010° C.), all three being sintered for about 3 minutes in a hydrogen atmosphere. The sintered compacts were cold rolled to about 0.10 inch (2.54 mm) thick or about a 50% reduction and re-sintered as before. Each was then cold rolled to 0.010 inch (0.254 mm) thick strip, a commonly used size for lead frames, with intermediate anneals as required. In each case, annealing was carried out in a dissociated ammonia atmosphere at about 1900° F. (1040° C.) for Examples 2 and 3 and at about 1650° F. (900° C.) for Example 1.

Specimens of Examples 1–3 were made from the 0.010 inch thick strip for thermal expansion and electrical resistivity tests, the measured results of which are given in Table III in the first line for each example designated "meas." The components of each Example are indicated under each example number, Cu or Fe for the copper or iron powders, and A or B for the powders of Alloys A or B. In addition, parallel values, designated "calc.," for the expansion coefficients are given for each example calculated by taking the average of the coefficients of the two components adjusted according to the volume percent of each in the composite. It should be noted that the properties for iron came from the National Bureau of Standards publication "Mechanical and Physical Properties of Metals and Alloys" and those for copper from an NBS data sheet on standard copper rather than from experimental measurement.

TABLE III

| | Thermal Expansion Coefficients ($10^{-6}$/°C.) from 25° C. to | | | | | Electrical Resistivity | |
|---|---|---|---|---|---|---|---|
| | 100° C. | 200° C. | 300° C. | 400° C. | 500° C. | Ω/cmf | μΩ-cm |
| Ex.1 meas. | 9.4 | 10.5 | 11.0 | 11.4 | 12.1 | 134 | 22.3 |
| (Cu+A) calc. | 10.8 | 11.0 | 11.1 | 11.8 | 12.9 | — | — |
| Ex. 2 meas. | 7.2 | 7.9 | 8.3 | 9.2 | 10.3 | 167 | 27.8 |
| (Fe+A) calc. | 8.7 | 9.0 | 9.3 | 10.0 | 11.3 | — | — |
| Ex. 3 meas. | 8.7 | 9.6 | 10.5 | 11.2 | 11.7 | 164 | 27.3 |
| (Fe+B) calc. | 10.5 | 11.1 | 11.4 | 11.6 | 12.2 | — | — |
| Alloy A | 5.2 | 5.0 | 5.0 | 5.9 | 7.9 | 400 | 66.5 |
| Alloy B | 8.7 | 9.4 | 9.3 | 9.1 | 9.7 | 290 | 48.2 |
| Copper | 16.9 | 17.4 | 17.8 | 18.1 | 18.4 | 10 | 1.7 |
| Iron | 12.2 | 12.8 | 13.4 | 13.9 | 14.5 | 60 | 10.0 |

Examples 1–3 all had the unique combination of low expansivity and high conductivity characteristic of this invention. Example 1, prepared from copper and Alloy A powders, had a lower resistivity (higher conductivity) than Example 2 prepared from iron and Alloy A powders, while Example 2 had a lower expansivity than Example 1. The differences in these properties of Examples 1 and 2 reflect the lower resistivity and higher expansivity of copper compared to iron, and illustrates how the properties of the composite strip depend on those of its component powders, and, more particularly, the effect of using different high-conductivity metal powders with the same low-expansivity alloy powder. Example 2, prepared from iron and −40 mesh Alloy A powders had a lower expansivity and slightly higher resistivity than Example 3 which was prepared from iron and −100 mesh Alloy B powders. In this case, different low-expansivity alloy powder components were combined with the same high-conductivity iron powder, and the differences in expansivity and resistivity of Examples 2 and 3 reflect the differences in those properties between Alloys A and B. However, although Alloy B has a much lower resistivity than Alloy A, 290 ohm/cmf as compared to 400 ohm/cmf, it can be seen that the resistivity of Example 3 is only slightly lower than that of Example 2, 164 ohm/cmf as compared to 167 ohm/cmf. This is believed to be at least partly the result of the coarser particle size distribution of the −40 mesh Alloy A powder as compared to the −100 mesh Alloy B powder, and serves to illustrate the effect of the particle size distributions of the component powders on the properties of the composite strip, as will be discussed further hereinbelow.

Another desirable feature of the present invention shown by Examples 1–3 is that the thermal expansivities of the composite strips were unexpectedly lower than those calculated for the strips as can be seen by comparing the measured values with the calculated values in Table III. The reason for these lower measurements is not fully understood, but is believed to be at least partly the result of some of the nickel in the lower expansivity alloy powder diffusing into the higher expansivity metal powder which would result in the lowering of the expansivity of both powders.

EXAMPLES 4–11

As additional illustrations of the present invention and to show the effects of certain process variables on the properties of the composite strip material, Examples 4–11 were made from mixtures of Alloy A powder and copper or iron powder as summarized in Table IV below. The component powders were the same as those previously described in connection with Examples 1–3. Each of the Examples 4–11 was a 50 w/o mixture of Alloy A powder with the elemental metal powder indicated in Table IV. The mesh sizes given in Table IV, either −230 (fine) or +100 (coarse), are the sizes to which the component powders for each example were sieved before mixing, having started with the particle size distributions as given in Table II. In addition, the sintering time in hours and the sintering temperature are also given for each example.

TABLE IV

| | | | Sintering Treatment | | |
|---|---|---|---|---|---|
| Ex. No. | Metal Component | Mesh Size | Time (hrs) | Temp. (°F.) | Temp. (°C.) |
| 4 | Copper | +100 | 0.05 | 1800 | 982 |
| 5 | Copper | −230 | 0.05 | 1800 | 982 |

TABLE IV-continued

| Ex. No. | Metal Component | Mesh Size | Sintering Treatment | | |
|---|---|---|---|---|---|
| | | | Time (hrs) | Temp. (°F.) | Temp. (°C.) |
| 6 | Copper | +100 | 1 | 1875 | 1024 |
| 7 | Copper | −230 | 1 | 1875 | 1024 |
| 8 | Iron | +100 | 0.05 | 2050 | 1121 |
| 9 | Iron | −230 | 0.05 | 2050 | 1121 |
| 10 | Iron | +100 | 1 | 2150 | 1177 |
| 11 | Iron | −230 | 1 | 2150 | 1177 |

Each mixture of powders was blended for ½ hour and compacted at room temperature and 132 ksi into cylindrical coupons 2 inches in diameter and 0.2 inches thick, one coupon being made for each example. Each coupon was then sintered in a dry hydrogen atmosphere at the temperature and for the time indicated for each example in Table IV. The sintered compacts were cold rolled 30 to 50%, with the amount of reduction given each compact being determined by its edge and surface integrity during rolling. After removing the checked edges, the samples were annealed and cold rolled to a suitable thickness, 0.060–0.1 inch, for preparing thermal expansion specimens. These were cut to 2 inch long and 0.25 inch wide specimens and annealed for ½ hour at 1150° F. for the copper/Alloy A specimens and 1600° F. for the iron/Alloy A specimens. The thermal expansion of each example was then measured on a recording dilatometer, with the average thermal expansion coefficient ($10^{-6}$/°C.) for each example from 25° C. to 400° C. given in Table V. The samples were again trimmed and cold rolled to a thickness suitable for electrical resistivity measurements, 0.010–0.020 inch thick. After annealing, as above, the electrical resistivities were measured and are given in Table V in ohm/cmf. Specimens of these samples were then cold rolled to 0.013 inch thick, annealed at 1875° F. in $NH_3$ and cold rolled to 0.010 inch thick for mechanical property tests. This uniform treatment was used for both the iron and copper-containing samples, although it will be recognized that for particular compositions, treatments can be readily determined by well-known metallurgical procedures to optimize desired mechanical properties. Bend tests were performed in both the transverse and longitudinal directions on specimens of Examples 8 and 9, the results as shown in Table V being the average number of 90° bends to failure in 3 tests on each strip.

TABLE V

| Ex. No. | Exp. Coeff. 25°–400° C. ($10^{-6}$/°C.) | Elect. Resis. Ω/cmf | Bend Tests No. to Failure | |
|---|---|---|---|---|
| | | | Tran. | Long. |
| 4 | 11.96 | 35 | — | — |
| 5 | 11.95 | 120 | — | — |
| 6 | 11.93 | 98 | — | — |
| 7 | 12.64 | 174 | — | — |
| 8 | 9.85 | 117 | 8 | 4 |
| 9 | 10.98 | 163 | 4.3 | 1.7 |
| 10 | 10.02 | 150 | — | — |
| 11 | 12.33 | 208 | — | — |

In general, a better combination of low expansivity and low resistivity (high conductivity) was obtained in both the copper-containing and iron-containing Examples which were formed from the coarser component powders with sintering at the lower temperatures for the shorter times. This can be seen by comparing Example 4 with Example 7 of the copper-containing strips and Example 8 with Example 11 of the iron-containing strips. The factors which are tested here, coarser powders, lower sintering temperature, and shorter sintering time, are all believed to reduce the amount of alloying between the powder particles in the strip material. By minimizing the alloying between the component powders in the composite strip, a better combination of expansivity and conductivity is provided.

The bend tests results indicate that strip made from coarser powders (Example 8) is more ductile than that made from finer powders (Example 9). In addition, the strip of Example 8 also had a better ductility that one made from Alloy A alone, which had corresponding average bend test results of 6 transversely and 4.7 longitudinally. Similar tests done on copper/Alloy A samples also indicated that coarser powders produce more ductile strip. This higher ductility can be an important factor because it is often necessary to bend lead frames formed from this strip several times during the manufacture of integrated circuit components.

Tensile test specimens were prepared from the 0.010 inch thick strip samples, and ultimate tensile strength (UTS), percent elongation (% El.) in a 2-inch length and hardness (Rockwell $R_b$) were determined. The results are shown in Table VI, with parallel results for a sample prepared from Alloy A alone also given for comparison.

TABLE VI

| Ex. No. | UTS (ksi) | % El | Hardness ($R_b$) |
|---|---|---|---|
| 4 | 61 | 1.6 | 68 |
| 5 | 96 | 2.1 | 84 |
| 6 | 79 | 1.8 | 68 |
| 7 | 102 | 2.3 | 84 |
| 8 | 88 | 2.1 | 82 |
| 9 | 118 | 2.2 | 86 |
| 10 | 91 | 2.6 | 81 |
| 11 | 123 | 2.6 | 87 |
| Alloy A | 102 | 5.1 | 80 |

Higher strengths, elongations and hardness were obtained from those samples made from the finer powders (Examples 5, 7, 9 and 11) as compared to those made from coarser powders (Examples 4, 6, 8 and 10), with the iron/Alloy A samples (Examples 8–11) higher than the corresponding copper/Alloy A samples (Examples 4–7). As previously discussed, all of these examples were prepared with the same finishing treatment which may not be the best treatment for obtaining optimum mechanical properties for these particular samples.

The low-expansivity metal powders and high conductivity metal powders in the above examples each consisted of a single substantially homogeneous composition. It is also contemplated that the compacted article in accordance with the present invention can also be made from blends of powders in which the component low expansivity powders and/or the high conductivity powders are themselves blends of two or more different metal powders, which can be either elemental or pre-alloyed powders as required to provide the desired properties.

Furthermore, compacted articles made in accordance with the present invention can also include additional material other than the low expansivity and high conductivity powders, provided that care is taken to insure that the desired expansivity and conductivity are obtained in the final product.

It is recognized that the method and product of the present invention will have a wide variety of uses, and it is not intended by reference to the substantially theoretical density of the compacted article to thereby restrict the scope of the present invention. In its preferred form, the present invention provides compacted articles having a density greater than 95% of theoretical and densities of about 99% or better are readily attained. It is also contemplated that, when desired, compacted articles of lower density can also be provided.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed.

What is claimed is:

1. A low thermal expansion, low electrical resistivity sintered, shaped electronic device member including a lead, comprising 15-85 volume percent of compacted particles of a first metal powder having an average thermal expansion coefficient over the range of 25° C. to 400° C. of less than about $12 \times 10^{-6}$/°C., and the balance compacted particles of a second metal powder having an electrical resistivity of less than 200 ohm/cmf, said compacted particles of both powders being substantially intermixed throughout said member, with said second metal powder having a corresponding 400° C. thermal expansion coefficient greater than that of said first metal powder, said first metal powder having an electrical resistivity greater than that of said second metal powder, and the extent of alloying between the particles of said first and second metal powders being so small that said member has a 400° C. thermal expansion coefficient less than that of said second metal powder and an electrical resistivity less than that of said first metal powder.

2. The member of claim 1 comprising about 40-60 volume percent of the compacted particles of said first metal powder.

3. The member of claim 1 in which said first metal powder comprises by weight about 20 to 55% nickel, up to about 25% cobalt, up to about 5% chromium, and the balance iron, the iron content being about 45 to 70%; and in which said second metal powder is selected from the group consisting in weight percent of (a) elemental iron comprising up to about 10% chromium, up to about 10% nickel, up to about 5% copper, and the balance at least about 90% iron, (b) elemental copper comprising up to about 20% nickel, up to about 20% zinc, up to about 10% aluminum, up to about 3% of iron or beryllium, and the balance at least about 80% copper, and (c) elemental nickel comprising up to about 20% copper, up to about 20% iron, and the balance at least about 80% nickel.

4. The member of claim 3 wherein said first metal powder has a 400° C. thermal expansion coefficient of less than about $10 \times 10^{-6}$/°C. and said second metal powder has an electrical resistivity of less than 100 ohm/cmf.

5. The member of claim 4 wherein said first metal powder contains about 35 to 52% nickel.

6. The member of claim 4 wherein said second metal powder is elemental iron containing at least 99% iron.

7. The member of claim 4 wherein said second metal powder is elemental copper containing at least 99% copper.

8. The member of claim 4 wherein said second metal powder is elemental nickel containing at least 99% nickel.

9. The member of claim 4 wherein the composition is balanced to provide a member with a 400° C. thermal expansion coefficient of less than about $12 \times 10^{-6}$/°C. and an electrical resistivity of less than about 200 ohm/cmf.

10. The member of claim 9 wherein the composition is balanced to provide a member with a 400° C. thermal expansion coefficient of less than about $10 \times 10^{-6}$/°C.

11. The member of claim 9 wherein the composition is balanced to provide a member with an electrical resistivity of less than about 150 ohm/cmf.

12. The member of claim 11 wherein the composition is balanced to provide a member with an electrical resistivity of less than about 150 ohm/cmf.

13. In a method for making a low thermal expansion, low electrical resistivity sintered, shaped electronic device member including a lead, the steps of making a mixture of about 15-85 volume percent of a first metal powder having an average thermal expansion coefficient over the range of 25° C. to 400° C. of less than about $12 \times 10^{-6}$/°C. with the balance a second metal powder having an electrical resistivity of less than 200 ohm/cmf, said second metal powder having a corresponding 400° C. thermal expansion coefficient greater than that of said first metal powder, and said first metal powder having an electrical resistivity greater than that of said second metal powder; and sintering and forming said mixture to a sintered and shaped member while controlling the amount of alloying between the particles of said first and second metal powders so that said sintered shaped member has a 400° C. thermal expansion coefficient less than that of said second metal powder and an electrical resistivity less than that of said first metal powder.

14. The method of claim 13 wherein said mixture is made of about 40-60 volume percent of said first metal powder.

15. The method of claim 13 in which said first metal powder comprises by weight about 20 to 55% nickel, up to about 25% cobalt, up to about 5% chromium, and the balance iron, the iron content being about 45 to 70%; and in which said second metal powder is selected from the group consisting in weight percent of (a) elemental iron comprising up to about 10% chromium, up to about 10% nickel, up to about 5% copper, and the balance at least about 90% iron, (b) elemental copper comprising up to about 20% nickel, up to about 20% zinc, up to about 10% aluminum, up to about 3% of iron or beryllium, and the balance at least about 80% copper, and (c) elemental nickel comprising up to about 20% copper, up to about 20% iron, and the balance at least about 80% nickel.

16. The method of claim 15 wherein forming said mixture includes applying pressure thereto to form a green preform, and densifying said preform by sintering at a temperature at least about 100° F. below the lower of the melting points of the two metal powders to form said member.

17. The method of claim 16 wherein said preform after being densified is cold rolled into strip, and then annealed at a temperature below that of said sintering temperature.

18. The method of claim 15 wherein said first metal powder has a 400° C. thermal expansion coefficient of less than about $10 \times 10^{-6}$/°C. and said second metal powder has an electrical resistivity of less than 100 ohm/cmf, and wherein the composition of said member is balanced to provide said member with a 400° C. thermal expansion coefficient of less than about $12 \times 10^{-6}$/°C. and an electrical resistivity of less than about 200 ohm/cmf.

19. The method of claim 18 wherein said first metal powder contains about 35 to 52% nickel.

20. The method of claim 18 wherein said second metal powder is elemental iron containing at least 99% iron.

21. The method of claim 18 wherein said second metal powder is elemental copper containing at least 99% copper.

22. The method of claim 18 wherein said second metal powder is elemental nickel containing at least 99% nickel.

23. The method of claim 18 wherein the composition is balanced to provide said member with a 400° C. thermal expansion coefficient of less than about $10 \times 10^{-6}$/°C.

24. The method of claim 18 wherein the composition is balanced to provide said member with an electrical resistivity of less than about 150 ohm/cmf.

25. The method of claim 23 wherein the composition is balanced to provide said member with an electrical resistivity of less than about 150 ohm/cmf.

* * * * *